(12) United States Patent
Okada

(10) Patent No.: US 11,770,894 B2
(45) Date of Patent: Sep. 26, 2023

(54) PRINTED CIRCUIT BOARD

(71) Applicant: SAMSUNG ELECTRO-MECHANICS CO., LTD., Suwon-si (KR)

(72) Inventor: Hiroki Okada, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 426 days.

(21) Appl. No.: 17/224,615

(22) Filed: Apr. 7, 2021

(65) Prior Publication Data

US 2022/0030704 A1     Jan. 27, 2022

(30) Foreign Application Priority Data

Jul. 22, 2020     (KR) ........................ 10-2020-0091153

(51) Int. Cl.
*H05K 1/02*     (2006.01)

(52) U.S. Cl.
CPC . *H05K 1/0278* (2013.01); *H05K 2201/09036* (2013.01)

(58) Field of Classification Search
None
See application file for complete search history.

(56) References Cited

U.S. PATENT DOCUMENTS

| | | | | |
|---|---|---|---|---|
| 4,931,134 A * | 6/1990 | Hatkevitz | ............ | H05K 3/4691 428/209 |
| 5,004,639 A * | 4/1991 | Desai | ................... | B32B 27/281 428/209 |
| 5,072,074 A * | 12/1991 | DeMaso | ............... | H05K 3/4691 156/251 |
| 5,206,463 A * | 4/1993 | DeMaso | ............... | H05K 3/4691 174/262 |
| 5,288,542 A * | 2/1994 | Cibulsky | .............. | H05K 3/4691 428/209 |
| 5,434,362 A * | 7/1995 | Klosowiak | ............. | H05K 5/003 174/254 |
| 6,162,996 A * | 12/2000 | Schmidt | ................. | H05K 1/028 174/254 |
| 6,288,343 B1 * | 9/2001 | Ahn | ...................... | H05K 3/4691 174/254 |
| 7,371,970 B2 * | 5/2008 | Flammer | .............. | H05K 1/0278 174/254 |
| 7,615,860 B2 * | 11/2009 | Su | ........................ | H05K 3/4691 174/254 |

(Continued)

FOREIGN PATENT DOCUMENTS

| | | |
|---|---|---|
| JP | H07-46708 B2 | 5/1995 |
| JP | 2002-158445 A | 5/2002 |

(Continued)

*Primary Examiner* — Krystal Robinson

(74) *Attorney, Agent, or Firm* — Morgan, Lewis & Bockius LLP

(57) ABSTRACT

A printed circuit board includes a rigid region and a flexible region; a first substrate disposed on the rigid region and the flexible region and comprising a first insulating layer and a first wiring layer comprising a first groove in the flexible region; and a second substrate disposed on the first substrate in the rigid region and comprising a first adhesive layer, a second insulating layer and a second wiring layer.

20 Claims, 8 Drawing Sheets

(56) References Cited

U.S. PATENT DOCUMENTS

| | | | | |
|---|---|---|---|---|
| 7,875,969 B2* | 1/2011 | Su | ......................... | H05K 3/4691 |
| | | | | 174/254 |
| 8,115,108 B2* | 2/2012 | Sakai | .................... | H05K 3/0061 |
| | | | | 174/265 |
| 8,159,777 B2* | 4/2012 | Zadesky | ................ | G06F 1/1626 |
| | | | | 360/99.13 |
| 8,238,109 B2* | 8/2012 | Sagisaka | .............. | H05K 3/4691 |
| | | | | 361/748 |
| 9,807,877 B1* | 10/2017 | Liu | ......................... | H05K 1/115 |
| 2004/0112632 A1* | 6/2004 | Michiwaki | ........... | H05K 3/4691 |
| | | | | 174/254 |
| 2013/0220535 A1* | 8/2013 | Lee | ...................... | H05K 3/0026 |
| | | | | 156/60 |
| 2014/0082937 A1* | 3/2014 | Park | ..................... | H05K 3/4691 |
| | | | | 29/847 |
| 2023/0121285 A1* | 4/2023 | Ha | ......................... | H05K 1/028 |
| | | | | 174/254 |

FOREIGN PATENT DOCUMENTS

| | | | |
|---|---|---|---|
| JP | 2004-319644 A | 11/2004 | |
| JP | 5034289 B2 | 9/2012 | |
| JP | 2018-190765 A | 11/2018 | |
| JP | 2018-195657 A | 12/2018 | |

\* cited by examiner

PRINTED CIRCUIT BOARD

CROSS-REFERENCE TO RELATED APPLICATION(S)

This application claims benefit of priority to Korean Patent Application No. 10-2020-0091153 filed on Jul. 22, 2020 in the Korean Intellectual Property Office, the disclosure of which is incorporated herein by reference in its entirety.

TECHNICAL FIELD

The present disclosure relates to a printed circuit board.

BACKGROUND

A printed circuit board (PCB) having a flexible region and a rigid region is used for the transmission of high frequency signals. Meanwhile, such a PBC may be formed by being stacked in a build-up method. In this case, the flexible region has a low thickness to secure properties such as flexibility, and the rigid region is formed to have a multilayer structure to reduce stress caused by mounting of electronic components, or the like, so as to have a higher thickness than the flexible region.

SUMMARY

An aspect of the present disclosure is to provide a printed circuit board (PBC) capable of minimizing an amount of a resin introduced into a flexible region.

Another aspect of the present disclosure is to provide a PBC having excellent flexibility.

Another aspect of the present disclosure is to provide a PBC preventing stress from being concentrated on an interface between a rigid region and a flexible region.

According to an aspect of the present disclosure, a printed circuit board may include a rigid region and a flexible region; a first substrate disposed on the rigid region and the flexible region and comprising a first insulating layer and a first wiring layer comprising a first groove in the flexible region; and a second substrate disposed on the first substrate in the rigid region and comprising a first adhesive layer, a second insulating layer and a second wiring layer.

According to an aspect of the present disclosure, a printed circuit board may include a first insulating layer including a first groove; a first wiring layer disposed on the first insulating layer, and including a pattern disposed on one side of the first groove; a second insulating layer disposed on the one side of the first groove to cover the pattern; a third insulating layer disposed on the second insulating layer; and a second wiring layer disposed on the third insulating layer and connected to the first wiring layer. A portion of the first insulating layer disposed on another side of the groove may be exposed from the second insulating layer and the third insulating layer, and a material included the second insulating layer may extend from the second insulating layer to be disposed in at least a portion of the first groove.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
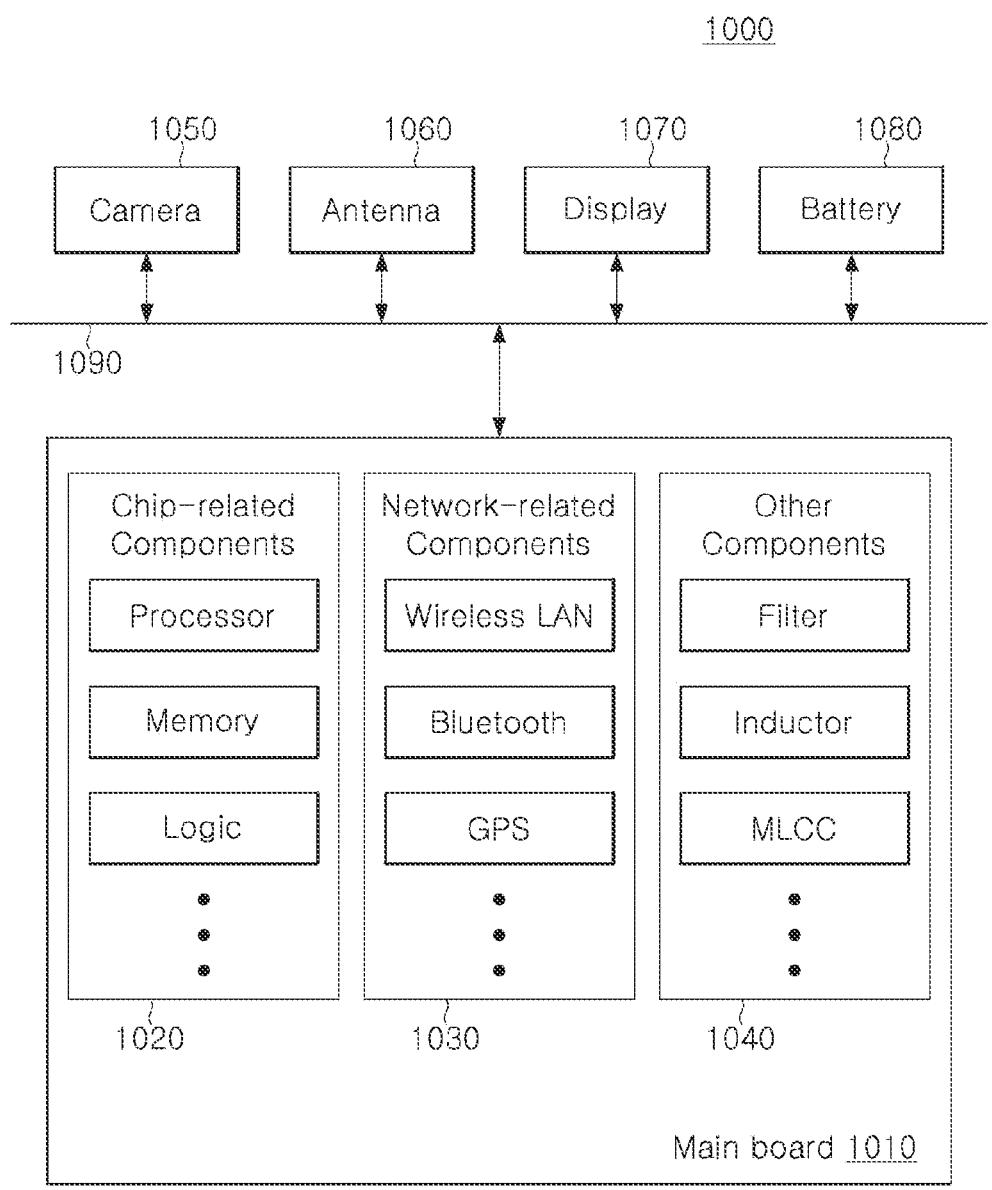
FIG. 1 is a block diagram schematically illustrating an example of an electronic device system.

Hereinafter, the present disclosure will be described with reference to the accompanying drawings. Shapes and sizes of the elements in the drawings may be exaggerated or reduced for clarity of description.

Electronic Devices

FIG. 1 is a block diagram schematically illustrating an example of an electronic device system.

Referring to FIG. 1, an electronic device 1000 accommodates a main board 1010 therein. The main board 1010 may include a chip-related component 1020, a network-related component 1030, other components 1040, and the like, physically and/or electrically connected thereto. These components may be connected to other electronic components to be described below to form various signal lines 1090.

The chip-related component 1020 may include a memory chip such as a volatile memory (for example, a dynamic random access memory (DRAM)), a non-volatile memory (e.g., a read only memory (ROM)), a flash memory, or the like; an application processor chip such as a central processor (e.g., a central processing unit (CPU)), a graphics processor (e.g., a graphics processing unit (GPU)), a digital signal processor, a cryptographic processor, a microprocessor, a microcontroller, or the like; and a logic chip such as an analog-to-digital converter, an application-specific integrated circuit (ASIC), or the like, but is not limited thereto. The chip-related components 1020 may also include other types of chip-related components. In addition, the chip-related components 1020 may be combined with each other. The chip-related component 1020 may be in the form of a package including the above-described chips or an electronic component.

The network-related component 1030 may include wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+ (HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols, but is not limited thereto. The network-related components 1030 may also include any of a variety of other wireless or wired standards or protocols. In addition, the network-related components 1030 may be combined with each other, together with the chip-related components 1020 described above.

The other component 1040 may include a high frequency inductor, a ferrite inductor, a power inductor, ferrite beads, a low temperature co-fired ceramic (LTCC), an electromagnetic interference (EMI) filter, a multilayer ceramic condenser (MLCC), or the like, but is not limited thereto. The other components 1040 may also include passive components used for various other purposes, or the like. In addition, the other component 1040 may be combined with each other, together with the chip-related component 1020 and/or the network-related component 1030 described above.

Depending on a type of the electronic device 1000, the electronic device 1000 may include other electronic components that may or may not be physically and/or electrically connected to the main board 1010. These other components may include, for example, a camera module 1050, an antenna module 1060, a display device 1070, a battery 1080, or the like, but is not limited thereto. The other components may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. The other component may also include other electronic components used for various purposes depending on a type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like, but is not limited thereto. The electronic device 1000 may be any other electronic device processing data.

Figure 2:
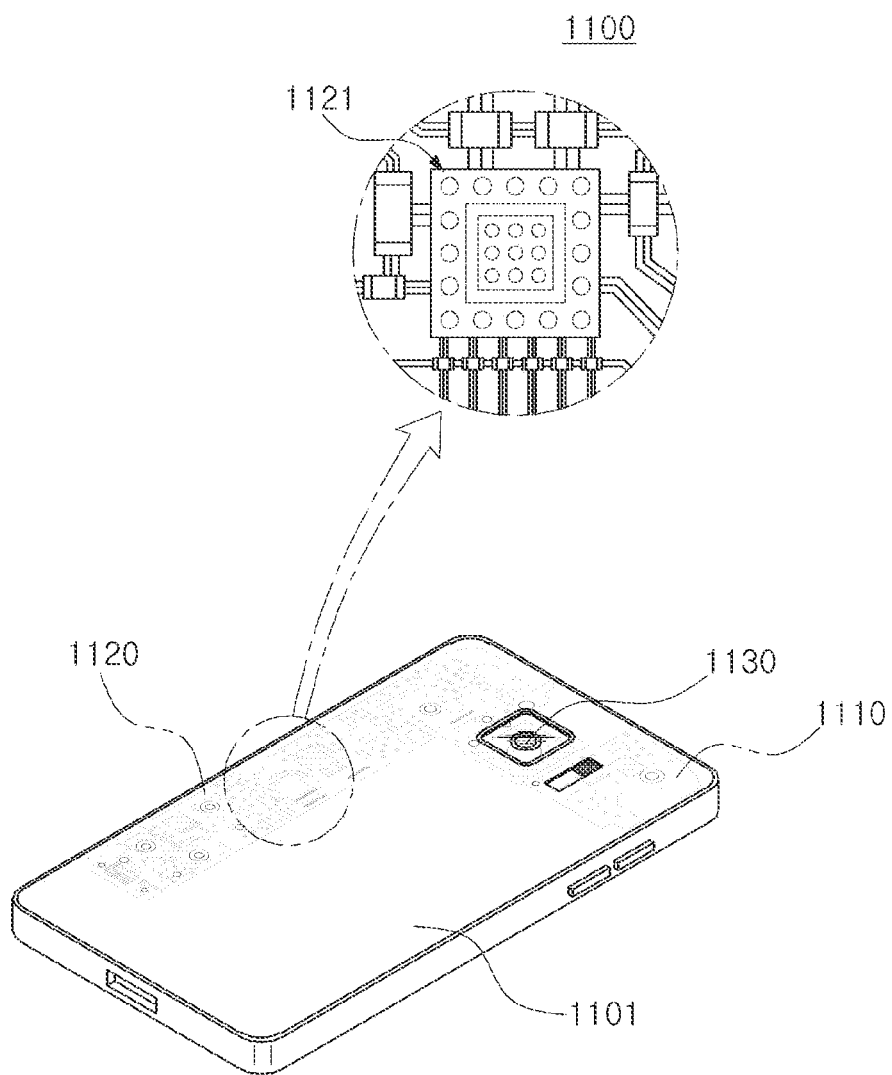
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A main board 1110 is accommodated in the smartphone 1100, and various electronic components 1120 may be physically and/or electrically connected to the main board 1110. In addition, other electronic components, such as a camera module 1130 and/or a speaker, which may or may not be physically and/or electrically connected to the main board 1110 may be accommodated therein. Some of the electronic components 1120 may be the above-described chip-related components, for example, a semiconductor package 1121, but are not limited thereto. The semiconductor package 1121 may be provided as a surface-mounted form in which a semiconductor chip or a passive component is mounted on a package substrate in the form of a multilayer electronic component-mounted board, but is not limited thereto. Meanwhile, the electronic device is not necessarily limited to the smartphone 1100, and may be other electronic devices as described above.

Printed Circuit Board

Figure 3A:
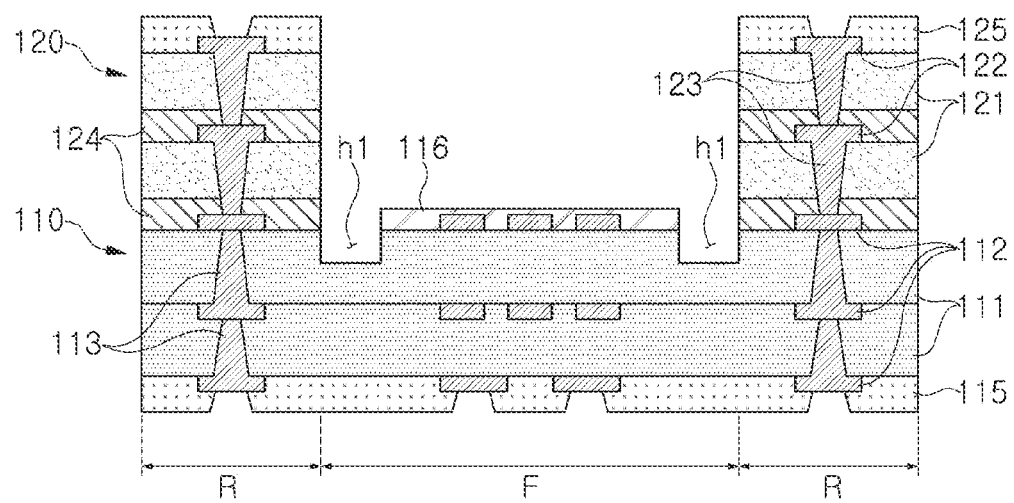
FIG. 3A is a cross-sectional view schematically illustrating an example of a printed circuit board according to the present disclosure.

FIG. 3A is a cross-sectional view schematically illustrating an example of a printed circuit board according to the present disclosure.

Referring to FIG. 3A, a printed circuit board 100A according to an example may have a flexible region F and a rigid region R and may include a first substrate 110 and a second substrate 120. The first substrate 110 is disposed in the rigid region R and the flexible region F, while the second substrate 120 is disposed on the first substrate 110 in the rigid region R. Accordingly, the flexible region F includes the first substrate, and the rigid region R includes the first and second substrates 110 and 120.

Meanwhile, in the specification, the flexible region F is a region having a property of being relatively easily bent as compared to the rigid region R, that is, a region having excellent flexibility. The rigid region R refers to a region having a property of being relatively difficult to be bent as compared to the flexible region F. However, the terms "flexible region F" and the "rigid region R" are terms for describing relative characteristics of the two regions, and thus, the rigid region R should not be understood as having no flexibility at all.

Meanwhile, in the printed circuit board according to an example, a first insulating layer 111 of the first substrate 110 includes a first groove h1. In this case, the first groove h1 may be formed on one surface, facing the second substrate 120, of the first insulating layer 111 and may penetrate a portion of the first insulating layer 111 in a direction from the one surface of the insulating layer 111 to the other surface.

As described below, in a printed circuit board according to another example, the groove may be formed on a surface opposite to the one surface facing the second substrate of the first insulating layer 111. Alternately, grooves may be formed in both surfaces of the first insulating layer 111. Accordingly, the groove may be disposed only in the one surface of the one surface and the other surface of the first substrate or on both surfaces.

The first groove h1 is disposed in the flexible region F, specifically in the flexible region F to be close to a boundary between the rigid region R and the flexible region F. Accordingly, as illustrated in the drawing, a portion of a wall surface of the first groove h1 may be disposed on a boundary between the rigid region R and the flexible region F, but is not limited thereto. For example, the wall surface of the first groove h1 may be quite spaced apart from the boundary of the rigid region R and the flexible region F to be disposed in the flexible region F.

Meanwhile, to provide a printed circuit board having a rigid region and a flexible region, substrates are stacked to form the rigid region having a greater thickness than the flexible region. In this case, the printed circuit board may include an adhesive layer, which may not be cured when stacked. An uncured resin forming the adhesive layer may be flow toward a side surface perpendicular to a stacked direction of the substrate into the flexible region. In this case, the flexible region may have reduced flexibility as a thickness thereof is reduced due to the introduced resin. Besides, stress may be concentrated due to the resin introduced at the boundary between the rigid region and the flexible region, thereby leading to a problem that the substrate may break.

Figure 3B:
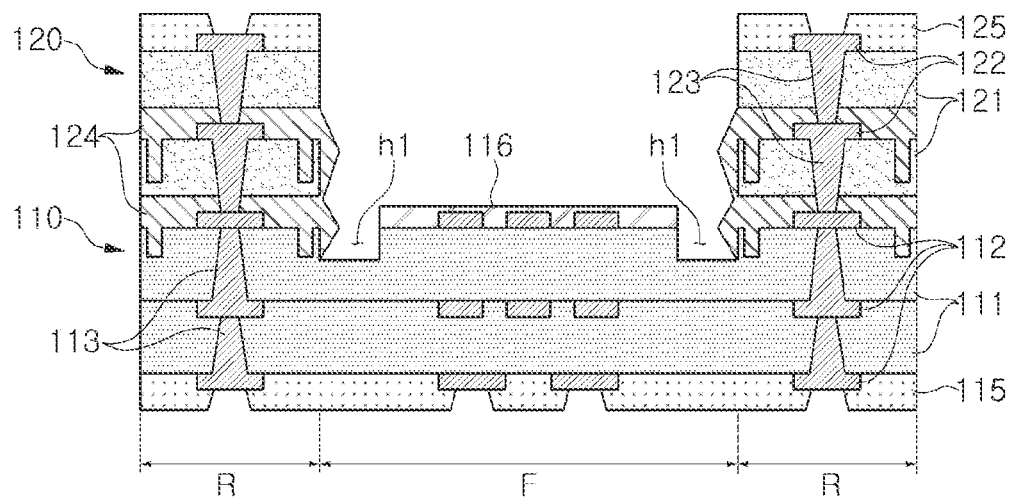
FIG. 3B is a cross-sectional view schematically illustrating an example of a printed circuit board according to the present disclosure.

In contrast, the printed circuit board according to an example may have a minimized amount of resin introduced into the flexible region as an uncured resin forming the first adhesive layer 124 of the second substrate 120 may flow along the wall surface of the first groove h1 or flow into the first groove h1 even though the resin flows toward the side surface perpendicular to the stacked direction of the first and second substrates 110 and 120. In one example, after curing, a material included in the first adhesive layer 124 may extend from the first adhesive layer 124 to be disposed in at least a portion of the first groove h1, as shown in FIG. 3B. Accordingly, flexibility can be prevented from being reduced as the thickness of the flexible region increases due to the introduced resin. Further, the problem in that the substrate may break due to the stress concentrated due to the introduced resin at the boundary between the rigid region R and the flexible region F may be prevented.

Hereinbelow, a configuration of the printed circuit board according to an example will be described in detail with reference to the drawing.

The printed circuit board according to an example has the rigid region R and the flexible region F.

As illustrated in the drawing, the rigid region R may be disposed on both sides of the flexible region F, but is not limited thereto. Numbers and dispositional forms, and the like, of the rigid region R and the flexible region F are not particularly limited. For example, the rigid region R may be disposed only on one side of the flexible region F, and numbers of the rigid region R and the flexible region F may be smaller or larger than those illustrated in the drawing.

Also, the printed circuit board according to an example includes the first substrate 110 and the second substrate 120.

The first substrate 110 may include a first insulating layer 111 having a first groove h1, a first wiring layer 112 disposed on the first insulating layer 111, and a first via layer 113 penetrating the first wiring layer and the first insulating layer 111 disposed on the first insulating layer 111 to be connected to the first wiring layer 111. Further, the first substrate 110 may further include a first protection layer 115 and/or a first cover layer 116.

A method for forming the first groove h1 is not particularly limited, but may be, for example, a known method such as mechanical processing, laser processing, or the like. A shape of the first groove h1 is not particularly limited and may have various shapes according to a method for forming the first groove h1. For example, the first groove h1 may include a region with an edge, an inclined region, a bent region, or the like.

The first insulating layer 111, the first wiring layer 112 and the first via layer 113 may be a plurality of the first insulating layers 111, a plurality of the first wiring layers 112, and a plurality of the first via layers 113, respectively. A plurality of the first wiring layers 112 may be disposed on a plurality of the first insulating layers 111, and a plurality of the first via layers 113 may penetrate a plurality of the first insulating layers 111 to connect to the first wiring layers 112 disposed on different layers.

However, numbers of the first insulating layers 111, the first wiring layers 112 and the first via layers 113 are not particularly limited. The first insulating layers 111, the first wiring layers 112 and the first via layers 113 may be a single first insulating layer 111, a single first wiring layer 112 and a single first via layers 113, respectively.

A material for forming the first insulating layer 111 is not particularly limited, and any material having insulating characteristics can be used unlimitedly.

However, a material for forming the first insulating layer 111 may be a flexible material having a low elastic constant for providing the flexible region F. As the material for forming the first insulating layer 111, polyimide (PI), polyethylene terephthalate (PET), polyethylene naphthalate (PEN), polycarbonate (PC), polyethersulfone (PES), polyacrylate (PAR), liquid crystal polymer (LCP), or the like, may be used. Further, the material for forming the first insulating layer 111 may not include a reinforcing material such as a glass fiber, a filler, or the like.

Alternately, the first insulating layer 111 may be formed of a material for minimizing signal transfer loss in a high frequency region. For example, liquid crystal polymer (LCP), polytetrafluoroethylene (PTFE), polyphenylene sulfide (PPS), polyphenylene ether (PPE), polyimide (PI), cycloolefin polymer (COP), polyether ether ketone (PEEK), or the like, may be used as the material for forming the first insulating layer 111.

In the case in which the first insulating layer 111 is present in plural, a plurality of the first insulating layers 111 may be formed of a same material or different materials and have a same thickness or different thicknesses. Further, boundaries between a plurality of the first insulating layers 111 may not be observed depending on the material forming the same.

The first wiring layer 112 may perform various functions depending on a design thereof. For example, the first wiring layer 112 may include a ground pattern, a power pattern, a signal pattern, or the like. The signal pattern includes various signals, for example, a data signal, an antenna signal, or the like, excluding the ground pattern, the power pattern, or the like.

The first wiring layer 112 may be formed of a conductive material, for example, copper (Cu), aluminum (Al), silver (Ag), tin (Sn), gold (Au), nickel (Ni), lead (Pb), titanium (Ti), or alloys thereof, but is not limited thereto.

The first via layer 113 may perform various functions depending on a design thereof. For example, the first via layer 113 may include a via for signal connection, a via for ground connection, a via for power connection, or the like.

The first via layer 113 may be also formed of a conductive material, for example, copper (Cu), aluminum (Al), silver (Ag), tin (Sn), gold (Au), nickel (Ni), lead (Pb), titanium (Ti), or alloys thereof, but is not limited thereto. Each via included in the first via layer 113 may be one having a via hole fully filled with a metal material or one in which a metal material is formed along a wall surface of the via hole. Further, the vias included in the first via layer 113 may be integrated with the first wiring layer 112 connected thereto.

The via included in the first via layer 113 may have a known shape, such as a tapered shape, an hourglass shape, a cylindrical shape, or the like. In the case in which the via included in the first via layer 113 has a tapered shape, vias included in different first via layers 113 may have a tapered shape in the same direction or in different directions.

The first protective layer 115 is disposed on the first insulating layer 111 and has an opening exposing at least a portion of the first wiring layer 112. The first protective layer 115 may be a solder resist layer, but is not limited thereto.

The cover layer 116 may protect the first wiring layer 112 externally exposed in the flexible region F. The first cover layer 116 may be formed of polyimide, but is not limited thereto.

The second substrate 120 may include a first adhesive layer 114, a second insulating layer 121 disposed on the first adhesive layer 114, a second wiring layer 122 disposed on the second insulating layer 121 and a second via layer 123 penetrating the second wiring layer 122 disposed on the second insulating layer 121, the second insulating layer 121 and the first adhesive layer 124 and connected to the second wiring layer 122. Further, the second substrate 120 may further include a second protective layer 125.

The first adhesive layer 124, the second insulating layer 121, the second wiring layer 122 and the second via layer 123 may be a plurality of the first adhesive layers 124, a plurality of the second insulating layers 121, a plurality of the second layers 122, and a plurality of the second via layers 123, respectively. A plurality of the second insulating layers 121 may be disposed on a plurality of the first adhesive layer 124, and a plurality of the second wiring layers 122 may be disposed on a plurality of the second insulating layers 121. A plurality of the second via layers 123 may penetrate a plurality of the second insulating layers 121 and a plurality of the first adhesive layers to connect to the first and second wiring layers 112 and 122 or connect the second wiring layers 122 disposed on different layers.

A material for forming the second insulating layer 121 is not particularly limited, and any material having insulating characteristics can be used unlimitedly. For example, the second insulating layer 121 may be formed of a thermosetting resin such as an epoxy resin, a thermoplastic resin such as polyimide, or a reinforcing material such as a glass fiber, a glass cloth, or a glass fabric and/or an inorganic filler, together with these, for example, prepreg, Ajinomoto build-up film (ABF), photo-imagable dielectric (PID), or the like, but is not limited thereto.

Meanwhile, the second insulating layer 121 may include the same material as or different materials from the first insulating layer 111. Even when the second insulating layer 121 includes the same material as the first insulating layer 122, the rigid region R including both the first insulating layer 111 and the second insulating layer 121 may have low flexibility as compared to the flexible region F including the first insulating layer 111 only.

In the case in which the second insulating layer 121 is in plural, a plurality of the second insulating layers 121 may be formed of a same material or different materials and have a same thickness or different thicknesses. Further, boundaries between a plurality of the second insulating layers 121 may not be observed depending on the material forming the same.

The second wiring layer 122 may perform various functions depending on a design thereof. For example, the second wiring layer 122 may include a ground pattern, a power pattern, a signal pattern, or the like. The signal pattern includes various signals, for example, a data signal, an antenna signal, or the like, excluding the ground pattern, the power pattern, or the like.

The second wiring layer 122 may be formed of a conductive material, for example, copper (Cu), aluminum (Al), silver (Ag), tin (Sn), gold (Au), nickel (Ni), lead (Pb), titanium (Ti), or alloys thereof, but is not limited thereto.

The second via layer 123 may perform various functions depending on a design thereof. For example, the second via layer 123 may include a via for signal connection, a via for ground connection, a via for power connection, or the like.

The second via layer 123 may be also formed of a conductive material, for example, copper (Cu), aluminum (Al), silver (Ag), tin (Sn), gold (Au), nickel (Ni), lead (Pb), titanium (Ti), or alloys thereof, but is not limited thereto.

Each via included in the second via layer 123 may be one having a via hole fully filled with a metal material or one in which a metal material is formed along a wall surface of the via hole. Further, the vias included in the second via layer 123 may be integrated with the second wiring layer 122 connected thereto.

The via included in the second via layer 123 may have a known shape, such as a tapered shape, an hourglass shape, a cylindrical shape, or the like. In the case in which the via included in the second via layer 123 has a tapered shape, vias included in different second via layers 123 may have a tapered shape in the same direction or in different directions.

The first adhesive layer 124 may serve to adhere insulating layers disposed in different layers. The first adhesive layer 124 is disposed between a plurality of the second insulating layers 121 and may adhere a plurality of the second insulating layers 121 to each other. Further, the first adhesive layer 124 is disposed between the first insulating layer 111 and the second insulating layer 121 and adhere the first and second insulating layers 111 and 121 to each other. Alternately, the first adhesive layer 124 may cover at least a portion of the second wiring layer 122 disposed between a plurality of the second insulating layers 121 or at least a portion of the first wiring layer 112 between the first and second insulating layers 111 and 121.

The first adhesive layer 124 may be formed of an epoxy-based thermosetting resin, prepreg, a bonding sheet, or the like, but is not limited thereto.

The first adhesive layer 124 may be thinner than the first insulating layer 111 and/or the second insulating layer 121, but is not limited thereto. The first adhesive layer 124 may have a same or similar thickness as the first insulating layer 111 and/or the second insulating layer 121 or a greater thickness than the first insulating layer 111 and/or the second insulating layer 121.

The second protective layer 125 is disposed on the second insulating layer 121 and has an opening exposing at least a portion of the second wiring layer 122. The second protective layer 125 may be a solder resist layer, but is not limited thereto.

Figure 4:
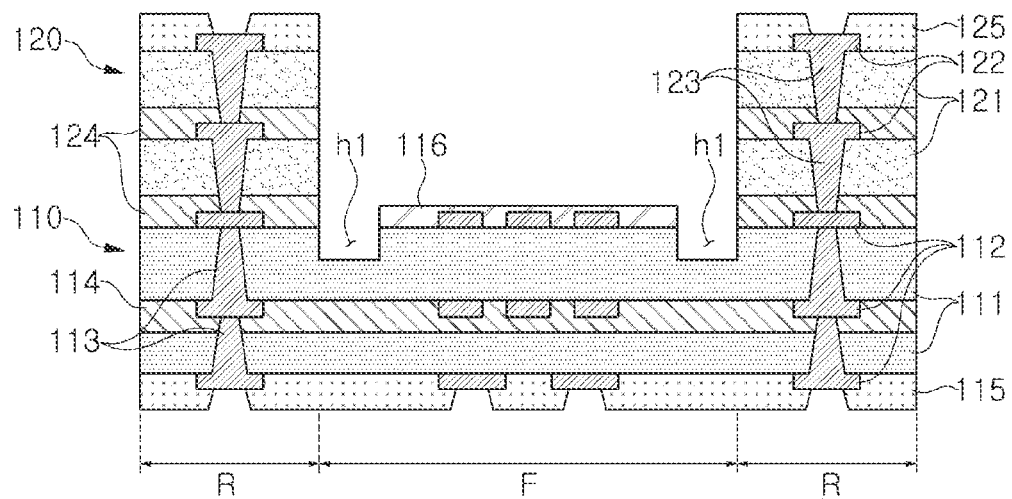
FIG. 4 is a cross-sectional view schematically illustrating another example of a printed circuit board according to the present disclosure.

FIG. 4 is a cross-sectional view schematically illustrating another example of a printed circuit board according to the present disclosure.

Referring to FIG. 4, a printed circuit board according to another example includes a first substrate 110 further including a second adhesive layer 114, as compared to the printed circuit board according to the example of FIG. 3A.

The second adhesive layer 114 may serve to adhere insulating layers disposed in different layers. The second adhesive layer 114 is disposed between a plurality of the first insulating layers 111 and may adhere a plurality of the first insulating layers 111 to each other. Further, the second adhesive layer 114 may cover at least a portion of the first wiring layer 112 disposed between a plurality of the first insulating layers 111.

The second adhesive layer 114 may be formed of an epoxy-based thermosetting resin, prepreg, a bonding sheet, or the like, but is not limited thereto. Further, the material for forming the second adhesive layer 114 may include the same materials as those for forming the first adhesive layer 124 or different materials from that for forming the first adhesive layer 124.

The second adhesive layer 114 may be thinner than the first insulating layer 111. Further, the second adhesive layer 114 may be thinner than the second insulating layer 121, but is not limited thereto. The second adhesive layer 114 may have the same or a similar thickness as the first insulating layer 111 and/or the second insulating layer 121 or a greater thickness than the first insulating layer 111 and/or the second insulating layer 121.

Other descriptions are substantially the same as those of the printed circuit board according to the example of FIG. 3A and are thus omitted. Although not shown in FIG. 4, a material included in the first adhesive layer 124 may extend from the first adhesive layer 124 to be disposed in at least a portion of the first groove h1, similar to the example of FIG. 3B.

Figure 5:
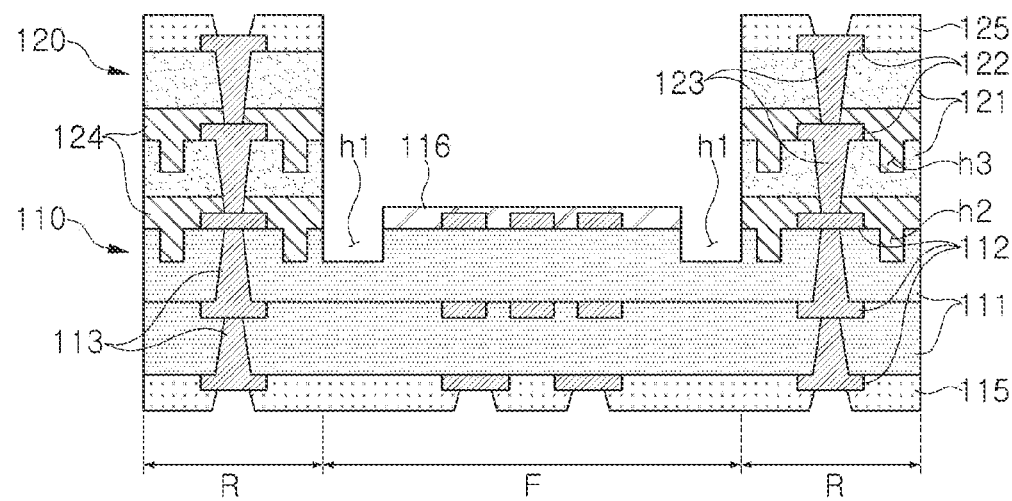
FIG. 5 is a cross-sectional view schematically illustrating another example of a printed circuit board according to the present disclosure.

FIG. 5 is a cross-sectional view schematically illustrating another example of a printed circuit board according to the present disclosure.

Referring to FIG. 5, a printed circuit board according to another example further includes a second groove h2 and a third groove h3, as compared to the printed circuit board according to the example of FIG. 4.

In the drawing, the printed circuit board according to another example is illustrated as having the first to third grooves h1 to h3, but is not limited thereto. The printed circuit board may include a portion of the first to third grooves h1 to h3. That is, the printed circuit board according to another example may have at least one of the first to third grooves h1 to h3. For example, the printed circuit board according to another example may have the first and second grooves h1 and h2 only, first and third grooves h1 and h3 only or the second and third grooves h2 and h3 only.

The second groove h2 is formed on one surface, facing the second substrate 120, of the first insulating layer 111 in the rigid region R. Accordingly, the first insulating layer 111 further includes the second groove h2 formed on the one surface of the first insulating layer 111 in the rigid region R. The second groove h2 may penetrate a portion of the first insulating layer 111 in a direction from the one surface of the first insulating layer 111 to the other surface thereof.

In this case, the first adhesive layer 124 is disposed between the first and second insulating layers 111 and 121 and may fill at least a portion of the second groove h2.

The third groove h3 is formed on a surface opposite to the one surface facing the first substrate 110 of the second insulating layer 121. Accordingly, the second insulating layer 121 includes the third groove h3 formed on the surface opposite to the surface, facing the first substrate 110, of the second insulating layer 121. The second groove h2 may penetrate a portion of the second insulating layer 121 in a direction from the surface opposite to the one surface, facing the first substrate 110, of the second insulating layer 121 to the surface facing the first substrate 110.

As previously described, the second insulating layer 121 may be a plurality of the second insulating layers 121, and the third groove h3 may be formed on any one of a plurality of the second insulating layers 121. However, the first adhesive layer 124 is not disposed on an uppermost second insulating layer 121, and accordingly, the uppermost second insulating layer 121 may not have the third groove h3.

In this case, the first adhesive layer 124 may be a plurality of the adhesive layers 124, and at least one of a plurality of the adhesive layers 124 is disposed between a plurality of the second insulating layers 121 to fill at least a portion of the third groove h3.

Meanwhile, in the printed circuit board according to another example, an uncured resin forming the first adhesive layer 124 of the second substrate 120 may flow down toward the second groove h2 and/or the third groove h3, when stacked. Accordingly, an amount of the resin introduced into the flexible region F may be more effectively minimized.

A formation method, a shape, and the like, of the second and third grooves h2 and h3 may be the same as those of the first groove h1.

Other descriptions are substantially the same as those of the printed circuit board according to the example of FIG. 3A and are thus omitted. Although not shown in FIG. 5, a material included in the first adhesive layer 124 may extend from the first adhesive layer 124 to be disposed in at least a portion of the first groove h1, similar to the example of FIG. 3B.

Figure 6:
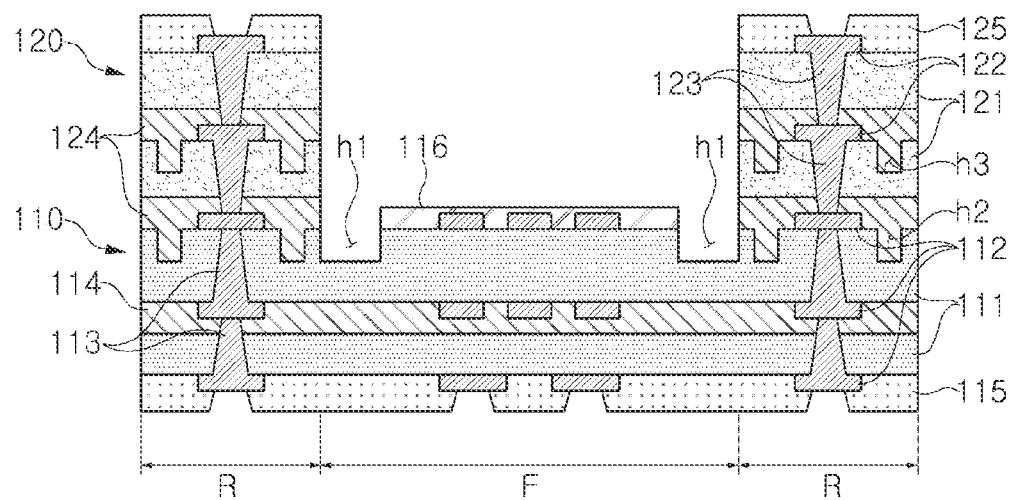
FIG. 6 is a cross-sectional view schematically illustrating another example of a printed circuit board according to the present disclosure.

FIG. 6 is a cross-sectional view schematically illustrating another example of a printed circuit board according to the present disclosure.

Referring to FIG. 6, the printed circuit board according to another example further includes a second groove h2 and a third groove h3, as compared to that according to the another example of FIG. 4.

Other descriptions are substantially the same as those of the printed circuit boards according to the examples of FIGS. 4 and 5 and are thus omitted. Although not shown in FIG. 6, a material included in the first adhesive layer 124 may extend from the first adhesive layer 124 to be disposed in at least a portion of the first groove h1, similar to the example of FIG. 3B.

Figure 7:
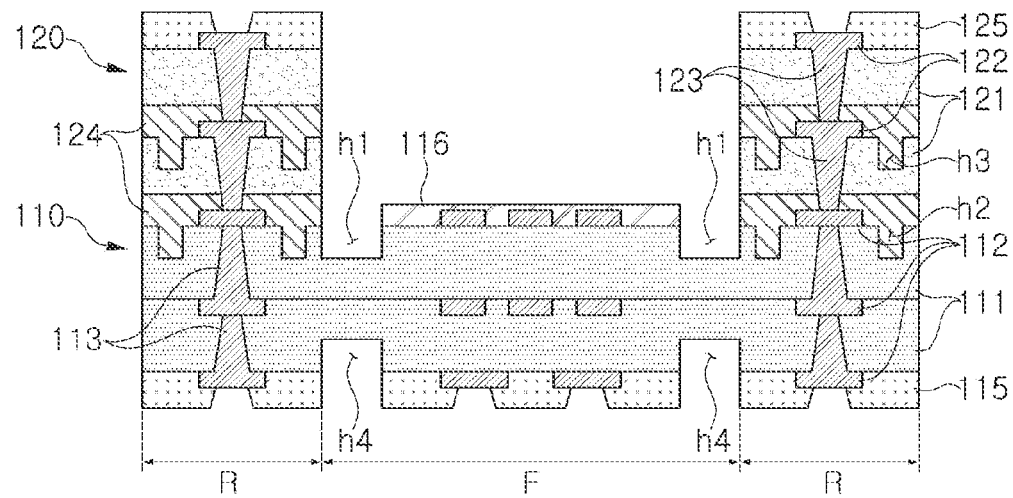
FIG. 7 is a cross-sectional view schematically illustrating another example of a printed circuit board according to the present disclosure.

FIG. 7 is a cross-sectional view schematically illustrating another example of a printed circuit board according to the present disclosure.

Referring to FIG. 7, the printed circuit board according to another example further includes a fourth groove h4, as compared to that according to the another example of FIG. 5.

The fourth groove h4 may be formed on the other surface, a surface opposite to one surface facing the second substrate 120 of the first insulating layer 111 in the flexible region F. Accordingly, the first insulating layer 111 may further include the fourth groove h4 formed on the other surface, a surface opposite to the one surface of the first insulating layer 111 having the first groove h1. The fourth groove h4 may penetrate a portion of the first insulating layer 111 in a direction from the other surface of the first insulating layer 111 to the one surface.

As illustrated in the drawing, in the case in which the first insulating layer 111 is a plurality of the first insulating layers 111, the fourth groove h4 may be formed on the first insulating layer 111 disposed on a layer different from the first layer 111 in which the first groove h1 is formed. In the case in which the first insulating layer 111 is a single first insulating layer 111, however, the fourth groove h4 may be formed on the first insulating layer 111 in which the first groove h1 is formed.

At least a portion of the first groove h1 and that of the fourth groove h4 may face each other. For example, the fourth groove h4 may be formed in a region corresponding to a region formed with the first groove h1. Accordingly, a region in the flexible region F of the printed circuit board, in which the first and fourth grooves h1 and h4 face each other, may have a significantly small thickness and further improved flexibility.

Meanwhile, in the drawing, the printed circuit board according to the another example is illustrated as having the first to fourth grooves h1 to h4, but is not limited thereto, and may have a portion thereof. That is, the printed circuit board according to the another example may include at least one of the first to fourth grooves h1 to h4.

A formation method, a shape, and the like, of the fourth groove h4 may be the same as those of the first groove h1.

Other descriptions are substantially the same as those of the printed circuit board according to the example of FIG. 5 and are thus omitted. Although not shown in FIG. 7, a material included in the first adhesive layer 124 may extend from the first adhesive layer 124 to be disposed in at least a portion of the first groove h1, similar to the example of FIG. 3B.

Figure 8:
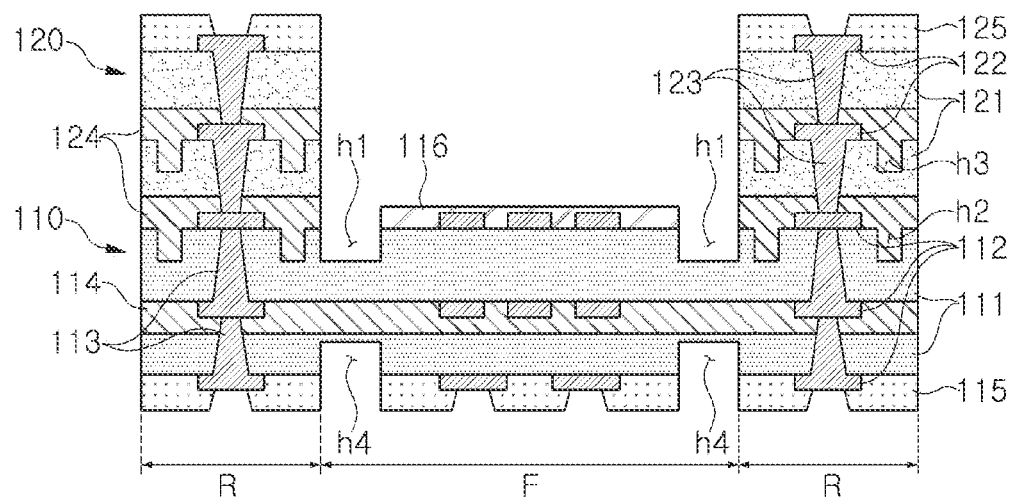
FIG. 8 is a cross-sectional view schematically illustrating another example of a printed circuit board according to the present disclosure.

FIG. 8 is a cross-sectional view schematically illustrating another example of a printed circuit board according to the present disclosure.

Referring to FIG. 8, a printed circuit board according to another example further includes a fourth groove h4, as compared to that according to the another example of FIG. 6.

Other descriptions are substantially the same as those of the printed circuit boards according to the examples of FIGS. 6 and 7 and are thus omitted. Although not shown in FIG. 7, a material included in the first adhesive layer 124 may extend from the first adhesive layer 124 to be disposed in at least a portion of the first groove h1, similar to the example of FIG. 3B.

Figure 9:
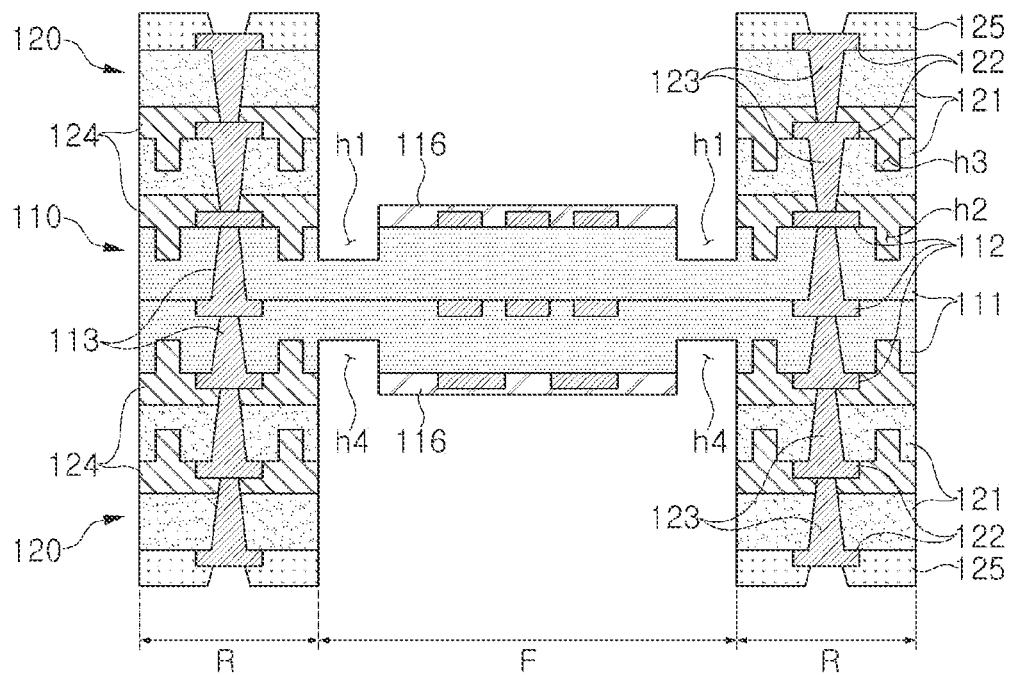
FIG. 9 is a cross-sectional view schematically illustrating another example of a printed circuit board according to the present disclosure.

FIG. 9 is a cross-sectional view schematically illustrating another example of a printed circuit board according to the present disclosure.

Referring to FIG. 9, a printed circuit board according to another example includes a second substrate 120 disposed on both sides of the first substrate, as compared to that according to the another example of FIG. 7.

Other descriptions are substantially the same as those of the printed circuit board according to the example of FIG. 7 and are thus omitted. Although not shown in FIG. 9, a material included in the first adhesive layer 124 may extend from the first adhesive layer 124 to be disposed in at least a portion of the first groove h1, similar to the example of FIG. 3B.

Figure 10:
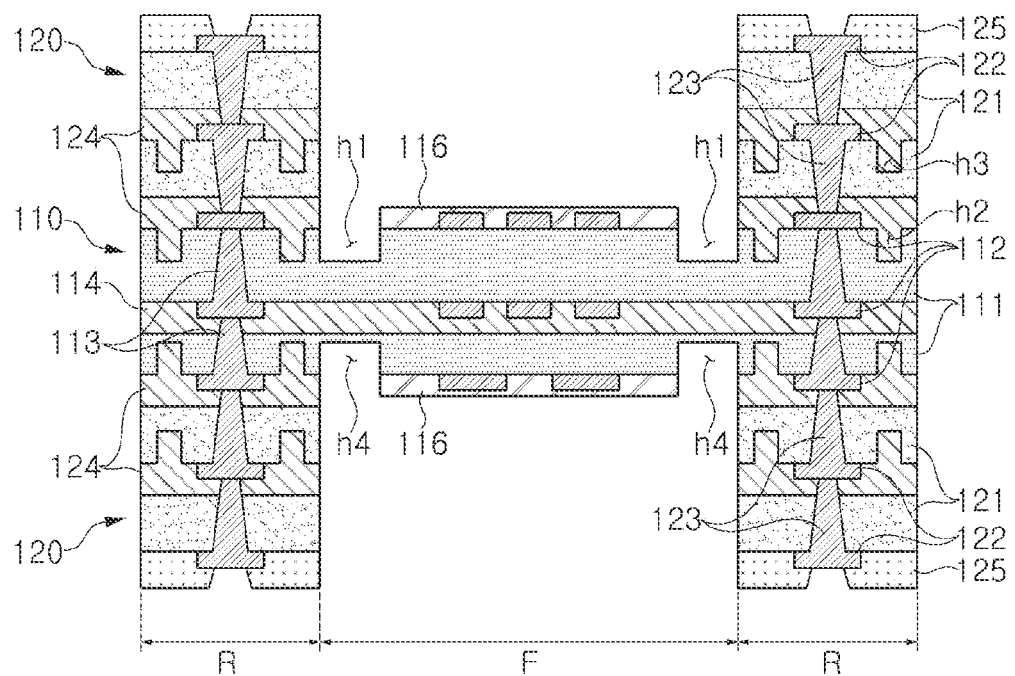
FIG. 10 is a cross-sectional view schematically illustrating another example of a printed circuit board according to the present disclosure.

FIG. 10 is a cross-sectional view schematically illustrating another example of a printed circuit board according to the present disclosure.

Referring to FIG. 10, a printed circuit board according to another example includes a second substrate 120 disposed on both sides of the first substrate, as compared to that according to the another example of FIG. 8.

Other descriptions are substantially the same as those of the printed circuit board according to the example of FIG. 8 and are thus omitted. Although not shown in FIG. 10, a material included in the first adhesive layer 124 may extend from the first adhesive layer 124 to be disposed in at least a portion of the first groove h1, and a material included in the first adhesive layer 124 may extend from the first adhesive layer 124 to be disposed in at least a portion of the fourth groove h4, similar to the example of FIG. 3B.

Figure 11:
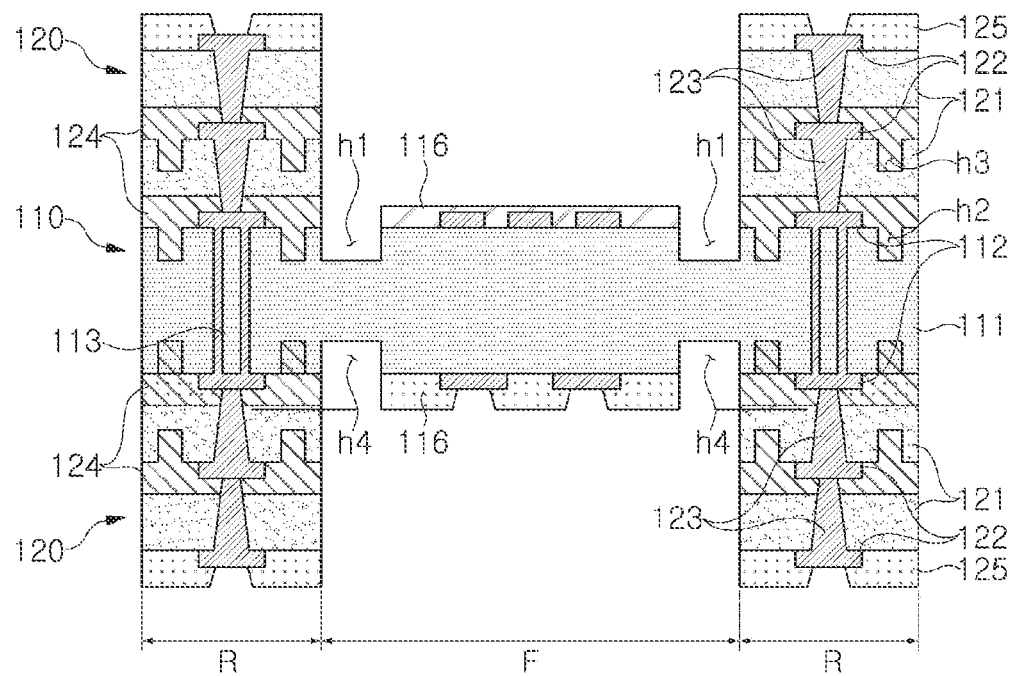
FIG. 11 is a cross-sectional view schematically illustrating another example of a printed circuit board according to the present disclosure.

FIG. 11 is a cross-sectional view schematically illustrating another example of a printed circuit board according to the present disclosure.

Referring to FIG. 11, a printed circuit board according to another example has a core substrate structure, as compared to that according to the another example of FIG. 9.

Specifically, the first substrate 110 including the second substrate 120 disposed on both sides thereof may include a first insulating layer 111 having a large thickness. For example, the first insulating layer 111 may be thicker than the second insulating layer 121.

This is, however, merely an example illustrating that the first substrate 110 can have various structures, and should not limit the structure of the printed circuit board according to the present disclosure.

Other descriptions are substantially the same as those of the printed circuit board according to the example of FIG. 9 and are thus omitted. Although not shown in FIG. 11, a material included in the first adhesive layer 124 may extend from the first adhesive layer 124 to be disposed in at least a portion of the first groove h1, and a material included in the first adhesive layer 124 may extend from the first adhesive layer 124 to be disposed in at least a portion of the fourth groove h4, similar to the example of FIG. 3B.

Figure 12:
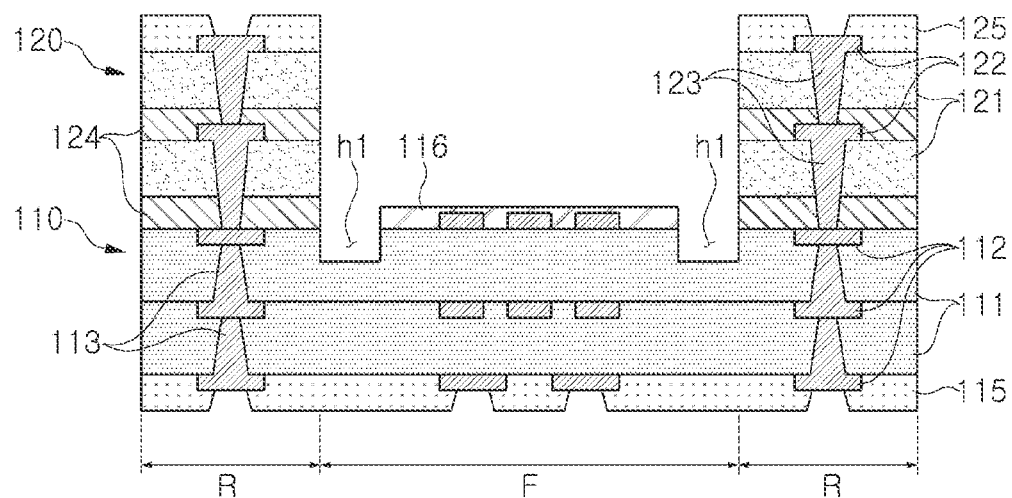
FIG. 12 is a cross-sectional view schematically illustrating another example of a printed circuit board according to the present disclosure.

FIG. 12 is a cross-sectional view schematically illustrating another example of a printed circuit board according to the present disclosure.

Referring to FIG. 12, in a printed circuit board according to another example, at least one first wiring layer 112, among a plurality of the first wiring layers 112, is embedded in the first insulating layer 111. For example, as illustrated in the drawing, an uppermost first wiring layer 112 may be embedded in an uppermost first insulating layer 111, among a plurality of the first insulating layers 111. Alternately, a lowermost first wiring layer 112, among a plurality of the first wiring layers 112, may be embedded in a lowermost insulating layer 111 among a plurality of the first insulating layers 111.

This is, however, merely an example illustrating that the first substrate 110 can have various structures, and should not limit the structure of the printed circuit board according to the present disclosure.

In addition, in the drawing, the printed circuit board according to the another example is illustrated as having the first groove h1 only, but may further anyone of the second to fourth grooves h2 to h4. Alternately, the printed circuit board may not have the first groove h1 but may have any one of the second to fourth grooves h2 to h4.

Other descriptions are substantially the same as those of the printed circuit board according to the example of FIG. 3A and are thus omitted. Although not shown in FIG. 12, a material included in the first adhesive layer 124 may extend from the first adhesive layer 124 to be disposed in at least a portion of the first groove h1, similar to the example of FIG. 3B.

Figure 13:
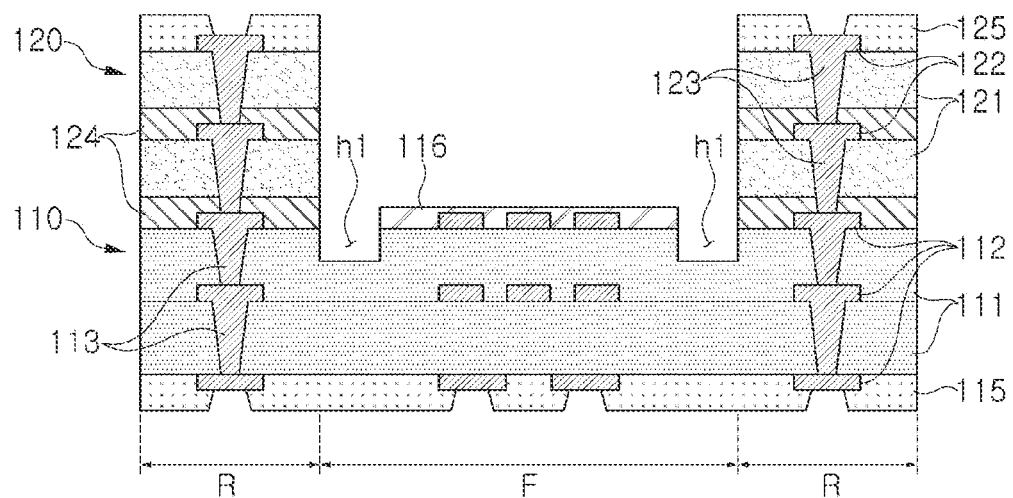
FIG. 13 is a cross-sectional view schematically illustrating another example of a printed circuit board according to the present disclosure.

FIG. 13 is a cross-sectional view schematically illustrating another example of a printed circuit board according to the present disclosure.

Referring to FIG. 13, a printed circuit board according to another example has a first wiring layer 112 and a first via layer 113 having different structures from those of the printed circuit board according to the example of FIG. 3A. For example, the first substrate 110 in the printed circuit board according to the another example, which includes the first insulating layer 111, the first wiring layer 112 and the first via layer 113, may be rotated by 180°.

This is, however, merely an example illustrating that the first substrate 110 can have various structures, and should not limit the structure of the printed circuit board according to the present disclosure.

In addition, in the drawing, the printed circuit board according to the another example is illustrated as having the first groove h1 only, but may further anyone of the second to fourth grooves h2 to h4. Alternately, the printed circuit board may not have the first groove h1 but may have any one of the second to fourth grooves h2 to h4.

Other descriptions are substantially the same as those of the printed circuit board according to the example of FIG. 3A and are thus omitted. Although not shown in FIG. 13, a material included in the first adhesive layer 124 may extend from the first adhesive layer 124 to be disposed in at least a portion of the first groove h1, similar to the example of FIG. 3B.

The expression "example" used in this specification does not refer to the same embodiment to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

In the present specification, the expressions of "first," second," etc. in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

As used herein, the term "connect" or "connection" in the present specification may be not only a direct connection, but also a concept including an indirect connection. In addition, the term "electrically connected" or "electrical connection" in the present specification is a concept including both a physical connection and a physical non-connection.

The terms used in the present disclosure are used only to illustrate various examples and are not intended to limit the present inventive concept. Singular expressions include plural expressions unless the context clearly dictates otherwise.

As an effect of the present disclosure, a printed circuit board (PBC) capable of minimizing an amount of a resin introduced into a flexible region may be provided.

As an effect of the present disclosure, a PBC having excellent flexibility may be provided.

As an effect of the present disclosure, a PBC capable of preventing stress from being concentrated on an interface between a rigid region and a flexible region may be provided.

While example embodiments have been illustrated and described above, it will be apparent to those skilled in the art that modifications and variations could be made without departing from the scope of the present disclosure as defined by the appended claims.

What is claimed is:

1. A printed circuit board, comprising:
a rigid region and a flexible region;
a first substrate disposed on the rigid region and the flexible region, the first substrate comprising a first insulating layer comprising a first groove in the flexible region, and a first wiring layer; and
a second substrate disposed on the first substrate in the rigid region and comprising a first adhesive layer, a second insulating layer and a second wiring layer.

2. The printed circuit board of claim 1, wherein the first groove is disposed adjacent to an interface between the rigid region and the flexible region.

3. The printed circuit board of claim 1, wherein the first groove is disposed in one surface of the first insulating layer, the one surface of the first insulating layer facing the second substrate.

4. The printed circuit board of claim 3, wherein the first insulating layer further comprises a second groove disposed in the one surface of the insulating layer in the rigid region.

5. The printed circuit board of claim 4, wherein the first adhesive layer is disposed between the first and second insulating layers and disposed in at least a portion of the second groove.

6. The printed circuit board of claim 5, wherein the second insulating layer comprises a third groove disposed in a surface of the second insulating layer opposite to one surface of the second insulating layer, the one surface of the second insulating layer facing the first substrate.

7. The printed circuit board of claim 6, wherein the adhesive layer, the second insulating layer and the second wiring layer include a plurality of adhesive layers, second insulating layers and wiring layers, respectively,
wherein a plurality of the second insulating layers are disposed on a plurality of the first adhesive layers, respectively
a plurality of the second wiring layers are disposed on a plurality of the second insulating layers, respectively, and
the third groove is disposed in any one of the plurality of the second insulating layers.

8. The printed circuit board of claim 7, wherein any one of the plurality of the first adhesive layers is disposed between two of the plurality of the second insulating layers and is disposed in at least a portion of the third groove.

9. The printed circuit board of claim 3, wherein the first insulating layer in the flexible region further comprises a second groove disposed in a surface of the first insulating layer opposite to the one surface comprising the first groove, and
at least a portion of the first groove and at least a portion of the second groove are recessed toward each other.

10. The printed circuit board of claim 1, wherein the adhesive layer is thinner than the second insulating layer.

11. The printed circuit board of claim 1, wherein the first insulating layer includes a plurality of the first insulating layers, and
the first substrate further comprises a second adhesive layer disposed between the plurality of the first insulating layers.

12. The printed circuit board of claim 1, wherein the first wiring layer is disposed on the first insulating layer,
the first adhesive layer is disposed on the first insulating layer to cover at least a portion of the first wiring layer,
the second insulating layer is disposed on the first adhesive layer, and
the second wiring layer is disposed on the second insulating layer.

13. The printed circuit board of claim 12, wherein the second substrate further comprises a via penetrating through the first adhesive layer and the second insulating layer to connect the first wiring layer and the second wiring layer,
wherein the via and the second wiring layer are integrated.

14. The printed circuit board of claim 1, wherein the first groove is disposed on an interface between the rigid region and the flexible region.

15. The printed circuit board of claim 1, wherein a material included in the first adhesive layer extends from the first adhesive layer to be disposed in at least a portion of the first groove.

16. A printed circuit board, comprising:
a first insulating layer including a first groove;
a first wiring layer disposed on the first insulating layer, and including a pattern disposed on one side of the first groove;
a second insulating layer disposed on the one side of the first groove to cover the pattern;

a third insulating layer disposed on the second insulating layer; and a second wiring layer disposed on the third insulating layer and connected to the first wiring layer, wherein a portion of the first insulating layer disposed on another side of the groove is exposed from the second insulating layer and the third insulating layer, and a material included the second insulating layer extends from the second insulating layer to be disposed in at least a portion of the first groove.

17. The printed circuit board of claim 16, wherein the second insulting layer includes a material different from the first insulating layer and the third insulating layer.

18. The printed circuit board of claim 16, wherein the first insulating layer further comprises a second groove on the one side of the first groove, and a portion of the second insulating layer is disposed in the second groove.

19. The printed circuit board of claim 16, wherein the first insulating layer includes a third groove, and the first groove and the third groove are disposed on opposing surfaces of the first insulating layer and recessed toward each other in a stack direction of the second insulating layer and the third insulating layer.

20. The printed circuit board of claim 16, wherein the first wiring layer and the second wiring layer are disposed on opposing surfaces of the third insulating layer.

* * * * *